United States Patent [19]

Kim

[11] Patent Number: 5,309,450
[45] Date of Patent: May 3, 1994

[54] ERROR CORRECTION CODING METHOD AND APPARATUS FOR DIGITAL IMAGE INFORMATION

[75] Inventor: Gye-jong Kim, Suwon, Rep. of Korea

[73] Assignee: Samsung Electronics Co., Ltd., Kyunggi-do, Rep. of Korea

[21] Appl. No.: 693,003

[22] Filed: Apr. 29, 1991

[30] Foreign Application Priority Data

Apr. 30, 1990 [KR] Rep. of Korea ............... 90-6125

[51] Int. Cl.$^5$ ............... H03M 13/00; G06F 11/10
[52] U.S. Cl. ............... 371/39.1; 371/2.1; 371/38.1; 348/469
[58] Field of Search ............... 371/39.1, 37.1, 38.1, 371/2.1, 50.1, 2.2, 37.4; 358/141

[56] References Cited

U.S. PATENT DOCUMENTS

| | | | |
|---|---|---|---|
| Re. 33,462 | 11/1990 | Suzuki | 371/39.1 X |
| 4,597,020 | 6/1986 | Wilkinson | 371/2.1 X |
| 4,661,956 | 4/1987 | Izumita | 371/37.1 |
| 4,688,225 | 8/1987 | Fukami | 371/37.1 |
| 4,764,927 | 8/1988 | Izumita | 371/38.1 |
| 4,789,902 | 12/1988 | Shimura | 371/2.2 X |
| 4,802,170 | 1/1989 | Trottier | 371/2.2 |
| 4,852,102 | 7/1989 | Yamaguchi | 371/2.1 |
| 5,159,452 | 10/1992 | Kinoshita | 371/37.1 X |

*Primary Examiner*—Charles E. Atkinson
*Assistant Examiner*—Glenn Snyder
*Attorney, Agent, or Firm*—Cushman, Darby & Cushman

[57] ABSTRACT

An error correction coding method and apparatus which can correct errors generated during the transmission or the storage, or the receiving or the reproducing of a digital image. The error correction coding method according to the present invention comprises the steps of: dividing one image into blocks to prevent the deterioration of the quality of a screen by preventing the generation of burst errors in a header during the transmitting or storing of the image information in the form of digital signals; compressing and coding each divided block into a block code having a header and video information; separating and arranging the compressed and coded header and video information so that successive headers do not overlap; and adding parity data into the separated and arranged header and video information. The apparatus for carrying out the error correction coding method of the present invention comprises an image divider, a data compressor, a parity data insert portion, and a data interleave portion. The data interleave portion comprises a demultiplexer, first and second memories, first and second counters, and first and second multiplexers.

8 Claims, 7 Drawing Sheets

FIG.4 (PRIOR ART)

| H11 | H12 | ... | H1i | D11 | D12 | ... | D2(k-1) | D1k | HP11 ...... HP11 |
|---|---|---|---|---|---|---|---|---|---|
| H21 | H22 | ... | H2i | D21 | D22 | ... | D2(k-1) | D2k | HP21 ...... HP21 |
| H31 | H32 | ... | H3i | D31 | D32 | ... | D3(k-1) | D3k | HP31 ...... HP31 |
| ... | ... | | ... | ... | ... | | ... | ... | ............ |
| H(i-1)1 | H(i-1)2 | ... | H(i-1)i | D(i-1)1 | D(i-1)2 | ... | D(i-1)(k-1) | D(i-1)k | HP(i-1)1...HP(i-1)i |
| Hi1 | Hi2 | ... | Hii | Di1 | Di2 | ... | Di(k-1) | Dik | HPi1 ...... HPii |
| VP11 | VP12 | ... | VP1i | VP1(i+1) | VP1(i+2) | ... | VP1(n-2) | VP1(n-1) | VP1n ..... VP1(n+1) |
| ... | ... | | ... | ... | ... | | ... | ... | ... |
| VPm1 | VPm2 | ... | VPmi | VPm(i+1) | VPm(i+2) | ... | VPm(n-2) | VPm(n-1) | VPmn ... VPm(n+1) |

FIG.8

| $H_{11}$ | $H_{12}$ | ... | $H_{1i}$ | $D_{11}$ | $D_{12}$ | ... | $D_{1k}$ | $D_{1(k-1)}$ | $HP_{11}$......$HP_{1l}$ |
|---|---|---|---|---|---|---|---|---|---|
| $D_{2k}$ | $D_{2(k-1)}$ | ... | $D_{21}$ | $H_{2i}$ | $H_{2(i-1)}$ | ... | $H_{22}$ | $H_{21}$ | $HP_{21}$......$HP_{2l}$ |
| $H_{31}$ | $H_{32}$ | ... | $H_{3j}$ | $D_{31}$ | $D_{32}$ | ... | $D_{3(k-1)}$ | $D_{3k}$ | $HP_{31}$......$HP_{3l}$ |
| ......... | ......... | ......... | ......... | ......... | ......... | ......... | ......... | ......... | ......................... |
| $H_{(i-1)1}$ | $H_{(i-1)2}$ | ... | $H_{(i-1)i}$ | $D_{(i-1)1}$ | $D_{(i-1)2}$ | ... | $D_{(i-1)(k-1)}$ | $D_{(i-1)k}$ | $HP_{(i-1)1}$~$HP_{(i-1)l}$ |
| $D_{lk}$ | $D_{1(k-1)}$ | ... | $D_{11}$ | $H_{il}$ | $H_{1(j-1)}$ | ... | $H_{i2}$ | $H_{i1}$ | $HP_{i1}$ ~ $HP_{il}$ |
| $VP_{11}$ $\vdots$ $VP_{m1}$ | $VP_{12}$ $\vdots$ $VP_{m2}$ | ... | $VP_{1i}$ $\vdots$ $VP_{mi}$ | $VP_{1(j+1)}$ $\vdots$ $VP_{m(j+1)}$ | $VP_{1(j+2)}$ $\vdots$ $VP_{m(j+2)}$ | ... | $VP_{1(n-2)}$ $\vdots$ $VP_{m(n-2)}$ | $VP_{1(n-1)}$ $\vdots$ $VP_{m(n-1)}$ | $VP_{1n}$ .... $VP_{1(n+1)}$ $\vdots$ $VP_{mn}$.. $VP_{m(n+1)}$ |

FIG.9

ERROR CORRECTION CODING METHOD AND APPARATUS FOR DIGITAL IMAGE INFORMATION

FIELD OF THE INVENTION

The present invention relates to a coding technique for transmitting or storing image information in the form of digital signals. More particularly, the present invention relates to an error correction coding method and apparatus which can correct an error generated when the digital image information is transmitted, stored, received, or reproduced.

BACKGROUND OF THE INVENTION

Coding techniques are generally used when a large amount of image information is first compressed and then coded to be transmitted or stored. One method of compressing the information involves dividing the whole image into small blocks. In this case, the compressed information consists of information generated in the unit of a pixel (hereinafter, referred to as video information) and information generated in the unit of a block (hereinafter, referred to as header information). Deterioration of the quality of the picture generated by an error in the header information is more severe than that generated by an error in the video information.

There are two types of errors, burst errors and random errors. Generally, random errors can be corrected by error correction coding systems, but burst errors cannot be corrected. Error correction coding systems therefore commonly use a method called shuffling to convert burst errors into random errors.

Generally in this shuffling coding method, all the image information is divided into small blocks (see FIG. 1). Each of these blocks is then compressed into a block code composed of header information and video information (see FIG. 2). These block codes are then coded to be transmitted or stored. If an error is generated when the digital image information is transmitted, stored, received, or reproduced, picture quality of the image deteriorates due to the generated error. Accordingly, an error correction coding technique has been developed to compensate for this problem with the above-described shuffling coding technique. In this error correction technique, in order to correct errors generated during transmitting or storing, or receiving or reproducing of the image information to obtain the original image, parity data is added to the image information before the information is coded. This conventional and known error correction coding method will be described below with reference to FIGS. 3, 4 and 5.

This conventional error correction coding method codes the image information into the form of a map such as the map shown in FIG. 3. As shown in FIG. 3, the compressed and coded block codes are arranged in a vertical direction. Parity data is added in the horizontal and vertical directions. With reference to detailed FIG. 4, the coded image information shown in FIG. 3 consists of header information Hij and video information Dik arranged in parallel in a vertical direction. Horizontal parity data HPil appears to the right side of the video information Dik. Vertical parity data VPm,n+1 is added in the portion below the header and video information Hij and Dik and below the horizontal parity data HPil.

When transmitted or stored, the coded image information shown in FIGS. 3 and 4 is transmitted or stored from up to down and from left to right as shown in FIG. 5 so that a group of header information and a group of video information is formed for transmission. If an error is generated during the process of transmitting or storing, or receiving or reproducing of a digital image, the error is corrected using the parity information HPil and VPm,n+1. Errors which exceed the error correction capability, however, cannot be corrected so they deteriorate the picture. In particular, errors in a header exceeding the error correction capability generally have worse effects on the picture than do errors generated in video information.

Thus, this conventional error correction coding method of FIGS. 3, 4 and 5 codes the information into a group of video information and a group of header information in such a way that burst errors may be generated between header information and also between video information. This conventional coding method therefore does not prevent the severe deterioration of picture quality caused by burst errors.

SUMMARY OF THE INVENTION

Accordingly, it is an object of the present invention to provide an error correction coding method and apparatus which prevents deterioration of picture quality by preventing the generation of burst errors in the headers which exceed correction capability when image information is transmitted or stored in the form of digital signals.

To achieve this object, the method of the present invention comprises the steps of:

dividing an image into units of blocks;

compressing and coding each block image divided in the image-dividing step into a block code having header information and video information;

separating and arranging the header information and the video information of the block code compressed and coded in the data compressing and coding step, thereby not overlapping the data; and adding parity data to the information separated and arranged in the data separating and arranging step.

To achieve this object, the apparatus of the present invention comprises:

an image divider for receiving digital image signals for the screen, dividing the received signals into minute blocks, and then outputting the digital image signals block by block;

a data compressor for compressing and coding the digital image signal, received from the image divider, into a block code composed of header information and video information;

a parity data insert portion for vertically arranging each block code received from the data compressor and then adding parity data; and a data interleave means connected between the data compressor and the parity data insert portion, and for alternatively arranging the header and video information of the block code to the adjacent header and video information of the adjacent block code, and then transmitting the information to the parity data insert portion, the block codes being received in the data compressor.

BRIEF DESCRIPTION OF THE DRAWINGS

The above object and other advantages of the present invention will become more apparent by describing the preferred embodiment of the present invention with reference to the attached drawings, in which:

FIG. 4 (Prior Art) is a detailed diagram of the conventional error correction coding map shown in FIG. 3;

FIG. 8 is a detailed diagram of the error correction coding map shown in FIG. 7; and FIG. 9 is an information format, when the information is transmitted according to the present invention.

DETAILED DESCRIPTION OF THE INVENTION

Figure 6:
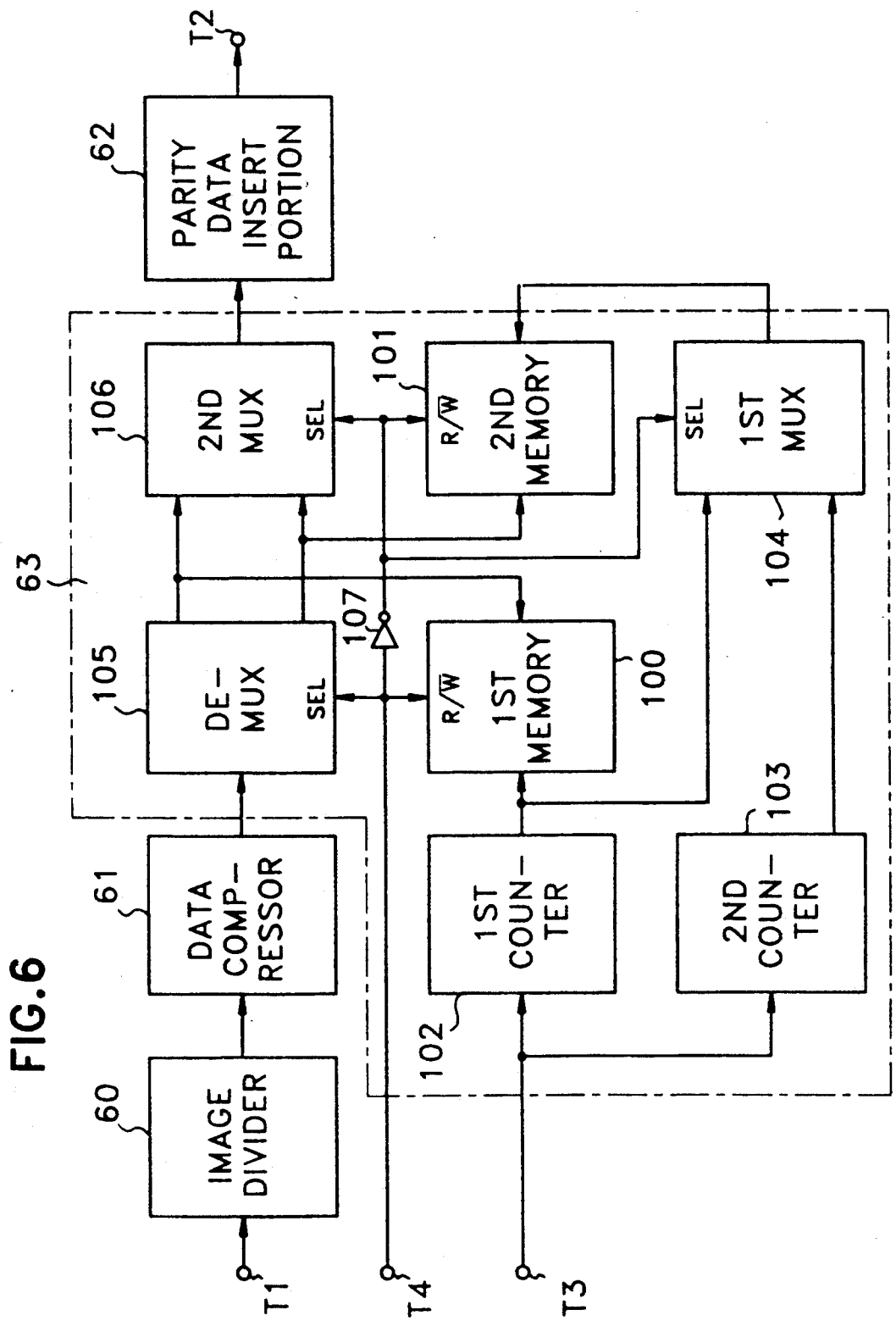
FIG. 6 is a circuit diagram of a preferred embodiment of an apparatus carrying out the error correction coding method according to the present invention.

FIG. 6 is a circuit diagram of an embodiment of the present invention. An image divider 60 is connected to a digital image source through an image input terminal T1. This image divider 60 receives the digital image signal for one frame from the digital image source, divides it into units of minute blocks, and supplies the digital image signal block by block. A data compressor 61 then compresses and codes the output of the image divider 60 into a block code composed of header and video information. A data interleave means 63 then arranges the header and video information of the block code so that it is alternated with that of an adjacent block code. A parity data insert portion 62 then vertically arranges the block codes disposed by the data interleave means 63 and sequentially transmits, word-by-word from up to down and then from left to right, the error correction coded image information formed by adding horizontal parity data and vertical parity data to an output terminal T2.

The data interleave means 63 comprises:

a first memory 100 for temporarily storing the block code compressed and coded in the data compressor 61;

a second memory 101 for temporarily storing the block code compressed and coded in the data compressor 61, in an opposite operation of the first memory 100;

a first counter 102 connected to a clock source through a clock input terminal T3, and for outputting a storage portion assigning address to the first memory 100;

a second counter 103 connected to the clock source through the clock input terminal T3, and for outputting a storage portion assigning address of a complementary type to the output of the first counter 102;

a first multiplexer 104 for selectively supplying outputs of the first and second counters 102 and 103 to the second memory 101;

a demultiplexer 105 for selectively supplying an output of the data compressor 61 to the first and second memories 100 and 101;

a second multiplexer 106 for selectively supplying the block code read out in the first and second memories 100 and 101 to the parity data insert portion 62, in an opposite operation of the demultiplexer 105; and an inverting element 107 whose input terminal is connected to a read/$\overline{\text{write}}$ input terminal (hereinafter, referred to as R/$\overline{\text{W}}$) of the first memory 100 and to a select input terminal of the demultiplexer 105, the output terminal of inverting element 107 being connected to a R/$\overline{\text{W}}$ input terminal of the second memory 101 and the select input terminals of the first and second multiplexers 104 and 106.

The operation of the circuit block diagram shown in FIG. 6 is described below in detail in relation to FIGS. 1, 2, 7, 8 and 9. Referring to FIG. 6, the image input terminal T1 receives a digital image signal from the digital image source, and supplies the received digital image signal to the image divider 60. The image output terminal T2 outputs the error correction coded digital image signal supplied from the parity data insert portion 62. The clock input terminal T3 is connected to a clock source to supply a clock pulse train received from the clock source to the first and second counters 102 and 103. The control input terminal T4 is connected to a processor (not shown) for controlling the image processing apparatus so as to receive a write-in/read-out control signal from the processor.

The image divider 60 sequentially stores the digital image signal, received from the digital image source through the image input terminal T1, in its memory in the unit of one frame. It then sequentially reads out the stored digital image signal by each storage region divided in the minute block unit and supplies this output to the data compressor 61 to divide the image information of one frame into units of minute blocks.

Figure 1:
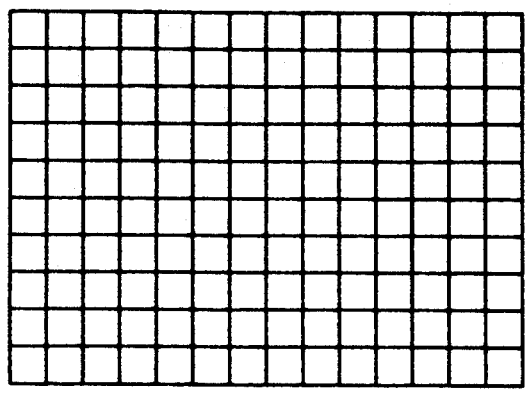
FIG. 1 is a diagram showing a state of the divided image.
Figure 2:
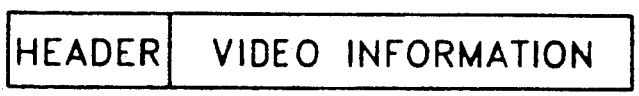
FIG. 2 is a code format for a unit block.
Figure 3:
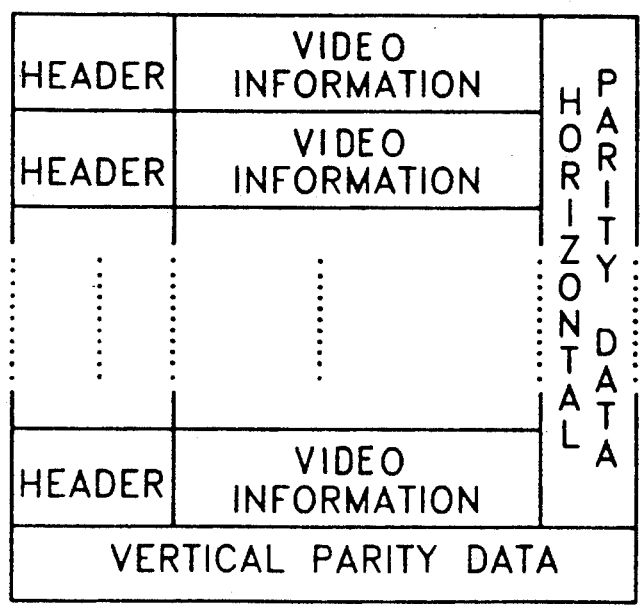
FIG. 3 (Prior Art) is a conventional error correction coding map.
Figure 5:
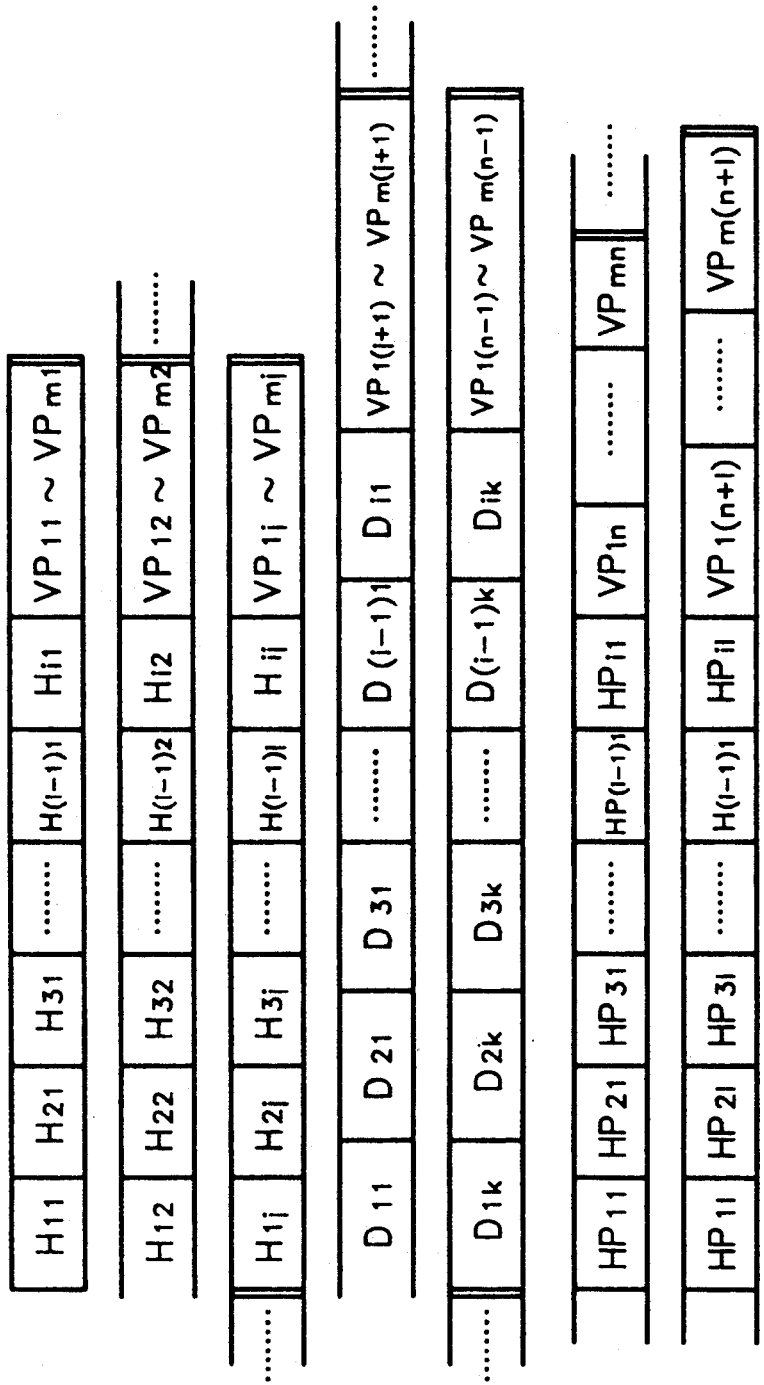
FIG. 5 (Prior Art) is an information format, when the information is transmitted using the conventional error correction coding method.

The data compressor 61 carries out discrete cosine transformation on the digital image signals of each block unit received from the image divider 60, then quantizes them according to the characteristics of images, and then again codes them by the Huffman's coding method to compress the information. Accordingly, a block code in the form of header information and video information shown in FIG. 2 is generated and supplied to the demultiplexer 105 in the data interleave means 63.

The data interleave means 63, which receives the block codes compressed and coded from the data compressor 61, alternatively arranges the header information and video information in the block codes, and supplies the information to the parity data insert portion 62, which will be described in detail.

The demultiplexer 105 alternatively supplies the block codes to the first and second memories 100 and 101 according to the logic state of the write-in/read-out control signal supplied to the selective input terminal SEL through the control input terminal T4. Accordingly, odd block codes are supplied to the first memory 100 and even block codes are supplied to the second memory 101.

The first counter 102 produces an increasing address which increments by "1" dependent upon a clock pulse train supplied from the clock source through the clock input terminal T3. This increasing address is supplied to the first memory 100 and the first multiplexer 104.

The second counter 103 produces a decreasing address which decrements by "1" dependent upon the same clock pulse train supplied from the clock source through the clock input terminal T3. This decreasing address is also supplied to the first multiplexer 104.

The first multiplexer 104 supplies the increasing address, i.e. the output of the first counter 102, or the decreasing address, i.e. the output of the second counter 103, to the second memory 101, according to the logic state of the inverted write-in/read-out control signal supplied to its selective input terminal SEL through the control input terminal T4 and the inverting element 107.

The first memory 100 repeats write-in and read-out operations, according to the logic state of the write-in/read-out control signal supplied to its input terminal R/W through the control input terminal T4. During writing-in, the information is written in sequence from the header information to the video information of an odd block code received from the demultiplexer 105 into addresses "0" to "FF" according to the increasing address supplied from the first counter 102. And during reading out, the information is also read out in sequence from the header information to the video information of the block code from addresses "0" to "FF" according to the increasing address supplied from the first counter 102. The information read out is also supplied to the second multiplexer 106.

The second memory 101 alternatively performs write-in and read-out operations according to the logic state of an inverted write-in/read-out control signal fed to its input terminal R/W through the control input terminal T4 and the inverting element 107. In the write-in operation, the even block code received from the demultiplexer 105 is written in sequence from the header information to the video information into addresses "0" to "FF" according to the increasing address received from the first counter 102 through the first multiplexer 104. During the read-out operation, however, the stored block code is read out from memory 101 in sequence from the end part of the video information to the head part of the header information according to the decreasing address fed from the second counter 103 through the first multiplexer 104. This read out in formation is also supplied to the second multiplexer 106.

The second multiplexer 106 is disposed to select alternatively the odd and even block codes read out from the first and second memories 100 and 101 according to the inverted write-in/read-out control signal R/W. This R/W signal is supplied to the select input terminal SEL of multiplexer 106 through the control input terminal T4 and inverting element 107. Multiplexer 106 supplies the block codes to the parity data insert portion 62.

Accordingly, when the output of the demultiplexer 105 is being supplied to the first memory 100, the second multiplexer 106 is outputting the block code, which is arranged in sequence from the end part of the video information to the head part of the header information and is read out from the second memory 101, to the parity data insert portion 62. In the alternative, when the output of the demultiplexer 105 is being supplied to the second memory 101, the second multiplexer 106 is outputting the block code which is arranged in sequence from the head part of the header information to the end part of the video information and is read out from the first memory 100, to the parity data insert portion 62.

Figure 7:
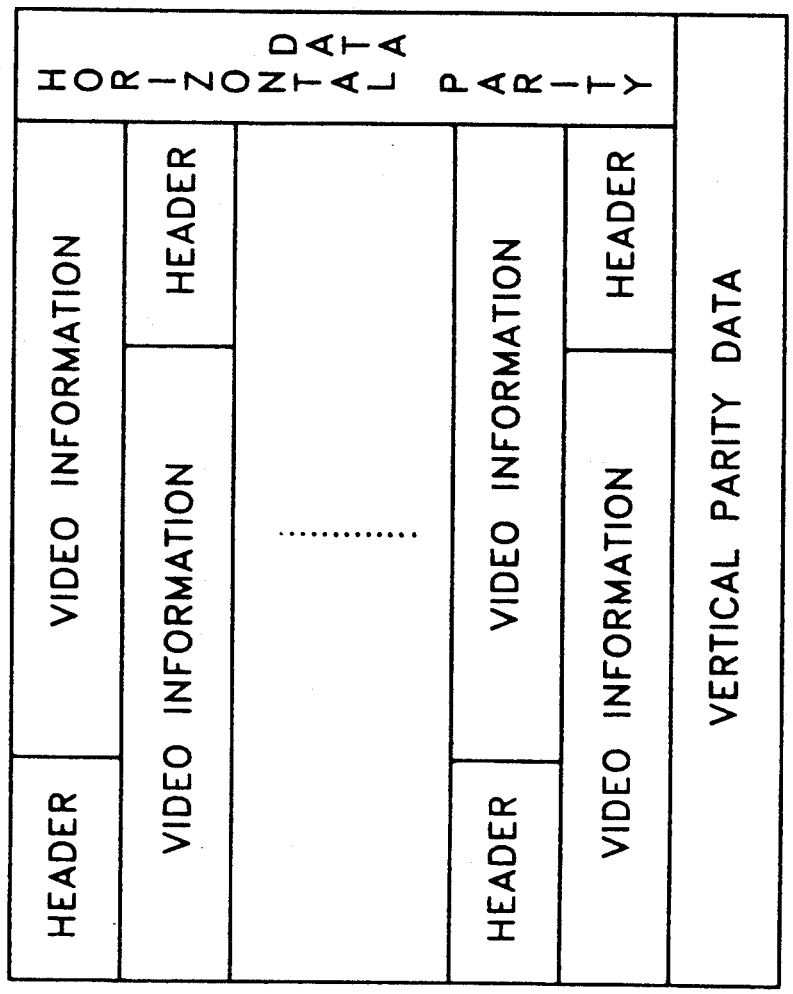
FIG. 7 is an error correction coding map of image information to be coded using the circuit shown in FIG. 6.
Figure 9:
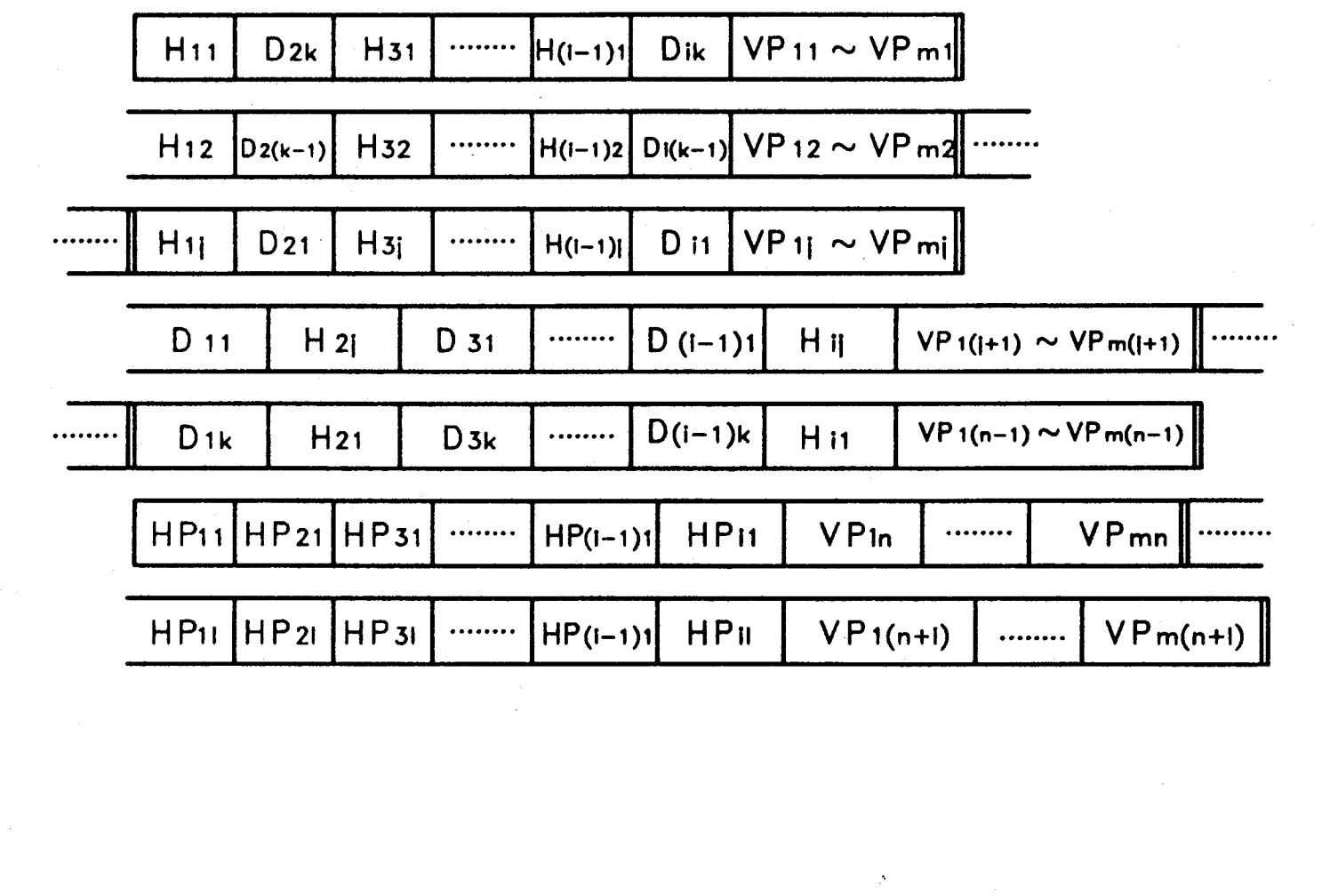

The parity data insert portion 62 then sequentially and vertically arranges the odd block code with the even block code, adds a horizontal parity data at the right end part and adds a vertical parity data at the bottom part. Accordingly, the error correction coded image information as shown in FIGS. 7 and 8 is produced. The image information is then sequentially read out bit-by-bit from up to down and from left to right so that the image signal, in which the header information and the video information are not overlapped (see FIG. 9), is output from image output terminal T2.

As described above, according to the present invention, while being transmitted or stored, or received or reproduced, the image information is arranged so that header information does not overlap with other header information. Accordingly, generation of burst errors in the header information group is prevented and the resultant deterioration of picture quality of the image is prevented.

What is claimed is:

1. An error correction coding method for a block code interleaving apparatus comprising the steps of:
    dividing an image of sequential image information into blocks, each of said blocks being arranged in a sequence substantially corresponding to an arrangement order of said sequential image information;
    compressing and coding said blocks into block codes on the basis of the sequence of said blocks, each block code having header information and video information arranged in a predetermined order;
    interleaving the block codes so that respective header information of a first block code and respective respective information of a subsequent block code are not vertically aligned, and so that respective video information of the first block code and the respective video information of the subsequent block code are also not vertically aligned; and
    adding parity data to the interleaved block codes.

2. An error correction coding method as claimed in claim 1, wherein said interleaving step comprises the steps of:
    demultiplexing the block codes compressed and coded in said compressing step into odd and even block codes;
    in a first data arrangement step, arranging the header and the video information of an odd block code separated during said demultiplexing step into said predetermined order;
    in a second data arrangement step, arranging the header and the video information of an even block code separated during said demultiplexing step into an order which is the reverse of said predetermined order; and
    sequentially multiplexing the odd and even block codes arranged in said first and second data arrangement steps.

3. An error correction coding apparatus in an image processing apparatus for transmitting or storing image information in the form of a digital signal, comprising:
    an image divider for receiving digital image signals for a screen, for dividing the received signal into blocks of digital image signals, and for then outputting the blocks;
    data compressing means for compressing and coding the blocks from the image divider into block codes, each block code comprising header information and video information arranged in a predetermined order;
    parity data insert means for vertically grouping the block codes from said data compressing means to generate parity data therefor; and
    data interleave means, coupled between said data compressing means and said parity data insert means, for arranging first ones of said block codes on the basis of said predetermined order, and arranging respective subsequent ones of said block codes in accordance with a grouping order which is different from said predetermined order such that the position of video and header information included there is reversed said data interleave means transmitting the arranged header and video information to said parity data insert means.

4. An error correction coding apparatus as claimed in claim 3, wherein said data interleave means comprises:

demultiplexing means for separating the block codes received from said data compressing means into odd and even block codes;

a first data arrangement means for arranging the header and video information of the odd block codes into the predetermined order corresponding to the first ones of said block codes;

second data arrangement means for arranging the header and video information of the even block codes into an order which is the reverse of the predetermined order corresponding to the subsequent ones of said block codes; and multiplexing means for alternatively selecting a block code from each of said first and second data arrangement means to supply the arranged block codes to said parity data insert means.

5. An error correction coding apparatus as claimed in claim 4, wherein said second data arrangement means comprises:

first storage means, coupled to said demultiplexing means and to said multiplexing means, for temporarily storing said even block codes output from the demultiplexing means; and means for generating an address for selecting a storage portion in said first storage means, said address being an increasing address during a write operation into said first storage means, and said address being a decreasing address during a read operation from said first storage means.

6. An error correction coding apparatus as claimed in claim 5, wherein said address generating means comprises:

first address counting means for repeatedly generating increasing addresses;

second multiplexing means for alternatively selecting the addresses output from said first and second address counting means so as to supply said address for assigning a storage portion to said first storage means.

7. An error correction coding apparatus as claimed in claim 6, wherein said first data arrangement means comprises:

second storage means, coupled to said demultiplexing means and to said multiplexing means, for temporarily storing said odd block codes output from the demultiplexing means; and third address counting means for continuously generating one of an increasing address and a decreasing address for assigning a storage portion of said second storage device independent of whether or not said second storage device is being read from or written to.

8. An error correction coding apparatus as claimed in claim 7, wherein said first storage means is read from when said second storage means is written to, and wherein said first storage means is written to when said second storage means is read from.

* * * * *